United States Patent
En et al.

(10) Patent No.: US 6,611,023 B1
(45) Date of Patent: Aug. 26, 2003

(54) FIELD EFFECT TRANSISTOR WITH SELF ALLIGNED DOUBLE GATE AND METHOD OF FORMING SAME

(75) Inventors: William G. En, Milpitas, CA (US); Srinath Krishnan, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/846,502

(22) Filed: May 1, 2001

(51) Int. Cl.[7] .................. H01L 29/76; H01L 29/94; H01L 27/108; H01L 27/01; H01L 27/12; H01L 27/0329; H01L 31/062; H01L 31/113; H01L 31/119

(52) U.S. Cl. .................. 257/350; 257/347; 257/349; 257/300; 257/394; 257/288

(58) Field of Search .................. 257/350, 347, 257/349, 300, 288, 384, 219, 226

(56) References Cited

U.S. PATENT DOCUMENTS

| | | | |
|---|---|---|---|
| 5,567,959 A | * | 10/1996 | Mineji |
| 5,604,655 A | * | 2/1997 | Ito |
| 5,619,054 A | * | 4/1997 | Hashimoto |
| 5,780,327 A | | 7/1998 | Chu et al. |
| 6,043,536 A | * | 3/2000 | Numatat et al. |
| 6,118,161 A | | 9/2000 | Chapman et al. |
| 6,166,412 A | | 12/2000 | Kim et al. |
| 6,184,556 B1 | | 2/2001 | Yamazaki et al. |
| 6,441,436 B1 | * | 8/2002 | Wu et al. |

* cited by examiner

Primary Examiner—John F. Niebling
Assistant Examiner—Ron Pompey
(74) Attorney, Agent, or Firm—Renner, Otto, Boisselle & Sklar, LLP

(57) ABSTRACT

A fully depleted silicon on insulator (SOI) field effect transistor (FET) includes a gate positioned above a channel region and an aligned back gate positioned below the channel region and the buried oxide later. Alignment of the back gate with the gate is achieved utilizing a disposable gate process and retrograde doping of the backgate.

9 Claims, 6 Drawing Sheets

FIELD EFFECT TRANSISTOR WITH SELF ALLIGNED DOUBLE GATE AND METHOD OF FORMING SAME

TECHNICAL FIELD

The present invention generally relates to the design of field effect transistors (FETS) using silicon-on-insulator (SOI) technology and, more particularly, to an SOI FET with a double gate structure.

BACKGROUND OF THE INVENTION

A conventional silicon on insulator (SOI) wafer includes an insulating buried oxide layer sandwiched between a thin silicon device layer above the buried oxide and bulk silicon below the buried oxide. Common methods for fabricating SOI wafers include a separation by implantation of oxygen (SIMOX) process in which oxygen is implanted into a bulk wafer at the desired depth and a wafer bonding process in which two wafers are bonded together with the oxide layer sandwiched there between and one of the two wafers is then polished to the desired device layer thickness.

SOI field effect transistor (FET) structures are fabricated within the silicon device layer. More specifically, isolation trenches within the device layer are etched and filled with insulating material to form electrically isolated "islands", each of which forms a FET body. A gate stack is then formed above a central portion of the body. Thereafter, a source region of the body and a drain region of the body, on opposing sides of the central gate, are doped to the opposite conductivity of the central channel region beneath the gate in a self aligned gate/source/drain doping process. The resulting structure includes a channel of a first conductivity positioned below the gate and between the source region and the drain region of the opposite conductivity. When a charge is applied to the gate which is above a threshold voltage, the channel depletes and current flows between the drain and the source.

An advantage of such SOI structure over conventional bulk silicon structures is improved frequency response. More specifically, the SOI FET structure has a significantly lower junction capacitance due to the reduced size of the source/channel junction and the drain/channel junction, thereby improving frequency response.

Because of a general need within the industry to continually reduce the size and cost of integrated circuit components, it is desirable to reduce the size of each FET such that a greater quantity of such FETs may be fabricated on a particular size wafer.

A problem associated with reducing the size of an SOI FET structure is: 1) a reduction in the length of the channel (distance between the source region and the drain region) degrades FET performance because of a phenomenon known as the short channel effect; and 2) a reduction in the width of the channel (dimension perpendicular to the length) shrinks the cross section of a depletion region along the bottom of the gate in which carrier flow occurs. Both such problems degrade FET performance when FET size is reduced.

More specifically, the decreased channel length permits depletion regions adjacent to the source region and the drain region to extend towards the center of the channel which increases the off state current flow through the channel (current flow when the gate potential is below threshold) and the reduced channel width tends to decrease current flow when the gate potential is above threshold.

Accordingly, there is a strong need in the art for a semiconductor field effect transistor structure which can be scaled to sub-micron dimension without significant performance degradation.

SUMMARY OF THE INVENTION

A first aspect of the present invention is to provide a self aligned double gate field effect transistor (FET). The FET comprises an active region that includes a central channel region and a source region and a drain region on opposing sides of the central channel region. An upper gate is positioned above the central channel region and isolated from the central channel region by an insulating gate oxide layer. A back gate is positioned below the central channel region and isolated from the central channel region by an insulating oxide layer which may be the insulating oxide layer of a silicon on insulator wafer. An isolation trench region is positioned about the periphery of the active region and includes a conductive via for electrically coupling the upper gate to the back gate. Both the upper gate and the back gate may extend over the same portion of the isolation trench region for electrical coupling to the via.

A second aspect of the present invention is to provide a semiconductor device including a plurality of FETs formed on a semiconductor substrate. The semiconductor substrate comprises an insulating oxide layer positioned within the semiconductor substrate and separating a device layer portion of the semiconductor substrate from a bulk portion of the semiconductor substrate. An insulating trench pattern positioned within the device layer isolates each of the plurality of FETs. Each FET comprises an active region positioned within the device layer and includes a central channel region and a source region and a drain region on opposing sides of the central channel region. An upper gate is positioned above the central channel region and isolated from the central channel region by an insulating gate oxide layer and a back gate is positioned below the central channel region and within the bulk portion of the semiconductor substrate and is isolated from the central channel region by the insulating oxide layer. A conductive via within the insulating trench pattern electrically couples the upper gate to the back gate. Both the upper gate and the back gate may extend over the same portion of the insulating trench pattern for electrical coupling to the via.

A third aspect of the present invention is to provide a method of fabricating a FET on a silicon on insulator wafer. The method includes the steps of: a) forming a disposable gate on a central portion of the surface of an active region of the wafer utilizing a first masking pattern; b) applying a mask coating to the surface of the active region; c) removing the disposable gate to expose a perforation within the mask coating; d) implanting a back gate within a bulk portion of the wafer at a location corresponding to the perforation; f) removing the mask coating; and g) forming a gate on the central portion of the surface of the active region of the wafer utilizing the first masking pattern.

The method may further include implanting a source region and a drain region on opposing sides of a central channel region utilizing the disposable gate to mask the central channel region for performing the implant. An isolation trench may be formed about the periphery of the active region to isolate the FET from other structures fabricated on the silicon on insulator wafer and an electrically conductive via may be formed within the insulating trench to electrically coupled the gate to the back gate.

The step of forming the disposable gate may include growing a gate oxide layer on the surface of the silicon on insulator wafer, depositing a layer of polysilicon on top of the gate oxide layer, forming a mask over the portion of the polysilicon layer corresponding to the disposable gate utilizing a first mask pattern, and etching an unmasked portion of the polysilicon layer.

The step of applying the mask coating may comprise applying a layer of a compound including at least one of nitride or oxide over the entire surface of the wafer and polishing the layer of compound to expose the disposable gate and the step of removing the disposable gate to form a perforation within the mask coating may comprise use of a dry etch process.

The step of forming the insulating trench pattern may include etching the insulating trench pattern through the silicon device layer above the insulating oxide layer of the wafer and filling the etched regions with an insulating compound.

The step of forming the electrically conductive via may include masking the surface of the wafer to define and expose the via, etching the insulating trench and insulating oxide layer to form the via, and filling the via with polysilicon.

In one embodiment, the first masking pattern utilized for forming the disposable gate and the gate provides for both the gate and the back gate to extend over a portion of the insulating trench pattern to provide for electrical coupling between the via and each of the gate and the back gate and the method may include a step of implanting the base substrate below the insulating trench about the periphery of the active region to provide for electrical coupling between the via and the back gate.

DESCRIPTION OF THE PREFERRED EMBODIMENTS

Figure 1:
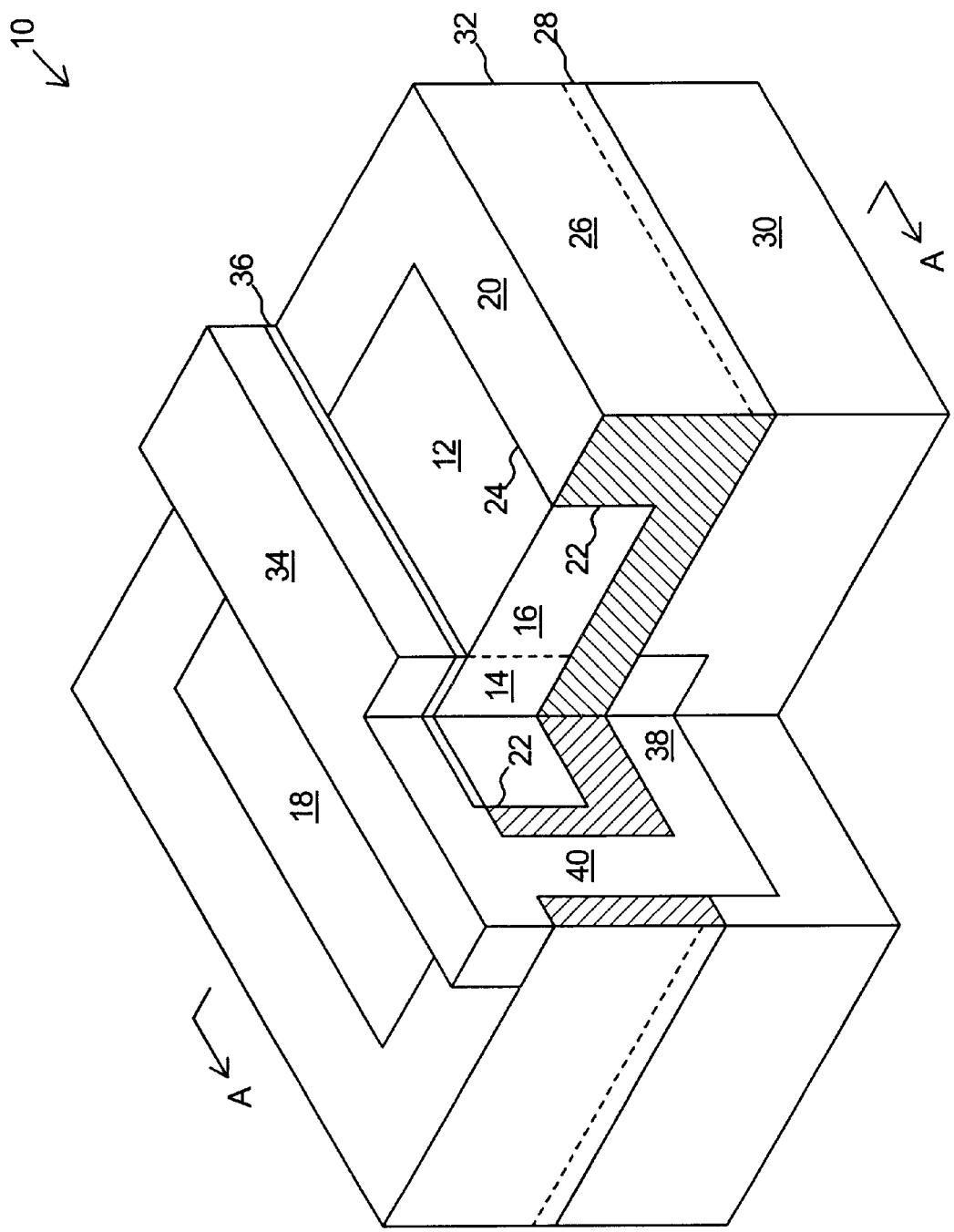
FIG. 1 is a cross-sectional view of an SOI FET in accordance with one embodiment of this invention.

The present invention will now be described in detail with reference to the drawings. Referring to FIG. 1, a fully depleted silicon on insulator (SOI) FET 10 is shown in accordance with this invention.

The FET 10 is formed within a thin silicon device layer 26 of an SOI wafer 32. The SOI wafer includes an insulating layer 28 beneath the silicon device layer 26 and a silicon substrate 30 beneath the insulating layer 28 such that the insulating layer isolates silicon structures, such as FET 10, from the silicon substrate 30.

The FET 10 includes an active region 12 which comprises a central channel region 14, a source region 16, and a drain region 18. In the exemplary embodiment of this invention, the channel region 14 is P-conductivity silicon while the source region 16 and the drain region 18 are each N-conductivity silicon.

The active region 12 is isolated by an insulating trench 20 which extends from the surface 21 of the silicon device layer 32 down to the insulating layer 28. The insulating trench 20 has side walls 22 which define the perimeter 24 of the active region 12 and function to isolate the active region 12 from other structures formed in the silicon device layer 32.

A polysilicon gate 34 is positioned above the channel region 14. A thin layer of insulating gate oxide 36 isolates the polysilicon gate 34 from the channel region 14. A polysilicon backgate 38 is positioned below the channel region and within the silicon substrate 30 such that the polysilicon backgate 38 is isolated from the channel region 14 by the insulating layer 28. The polysilicon gate 34 and the polysilicon backgate 38 are precisely aligned to avoid degradation of performance due to overlap capacitance caused by gate misalignment. A polysilicon via 40 is positioned within the insulating trench 20 and electrically couples the polysilicon gate 34 to the polysilicon backgate 38.

In operation, when a FET activation potential, above a threshold potential, is applied to the polysilicon gate 34, the via 40 couples the polysilicon gate 34 to the backgate 38 so that the backgate also achieves FET activation potential. The FET activation potential on the polysilicon gate 34 causes depletion within the upper portion of the channel region 14 and the FET activation potential on the polysilicon backgate 34 caused depletion within the lower portion of the channel region 14 to form a fully depleted channel. Current then flows between the source region 16 and the drain region 18.

It should be appreciated that the above described structure improves FET performance over a similarly structured FET with only a single gate positioned above the central channel region. More specifically, for a FET of a particular channel length (e.g. distance between the source region and the drain region), and a particular channel width (e.g. width of the source/channel junction and drain/channel junction) depletion within a region along the surface area of the channel adjacent to either the gate or the backgate is effectively doubled over a FET with only a single gate such that on—state current flow can be achieved at a lower threshold voltage.

Alternatively, the above described structure permits scaling the FET to a smaller size while maintaining similar performance characteristics of a single gate FET of a much larger size. More particularly, the reduced threshold voltage required to achieve on-state current flow enables the FET to have a thinner gate oxide layer between the channel and the gate (and the channel and the backgate). The thinner oxide layer reduces short channel effects thereby permitting the FET size to be scaled smaller without experiencing punch-through due to short channel effects.

Figure 2:
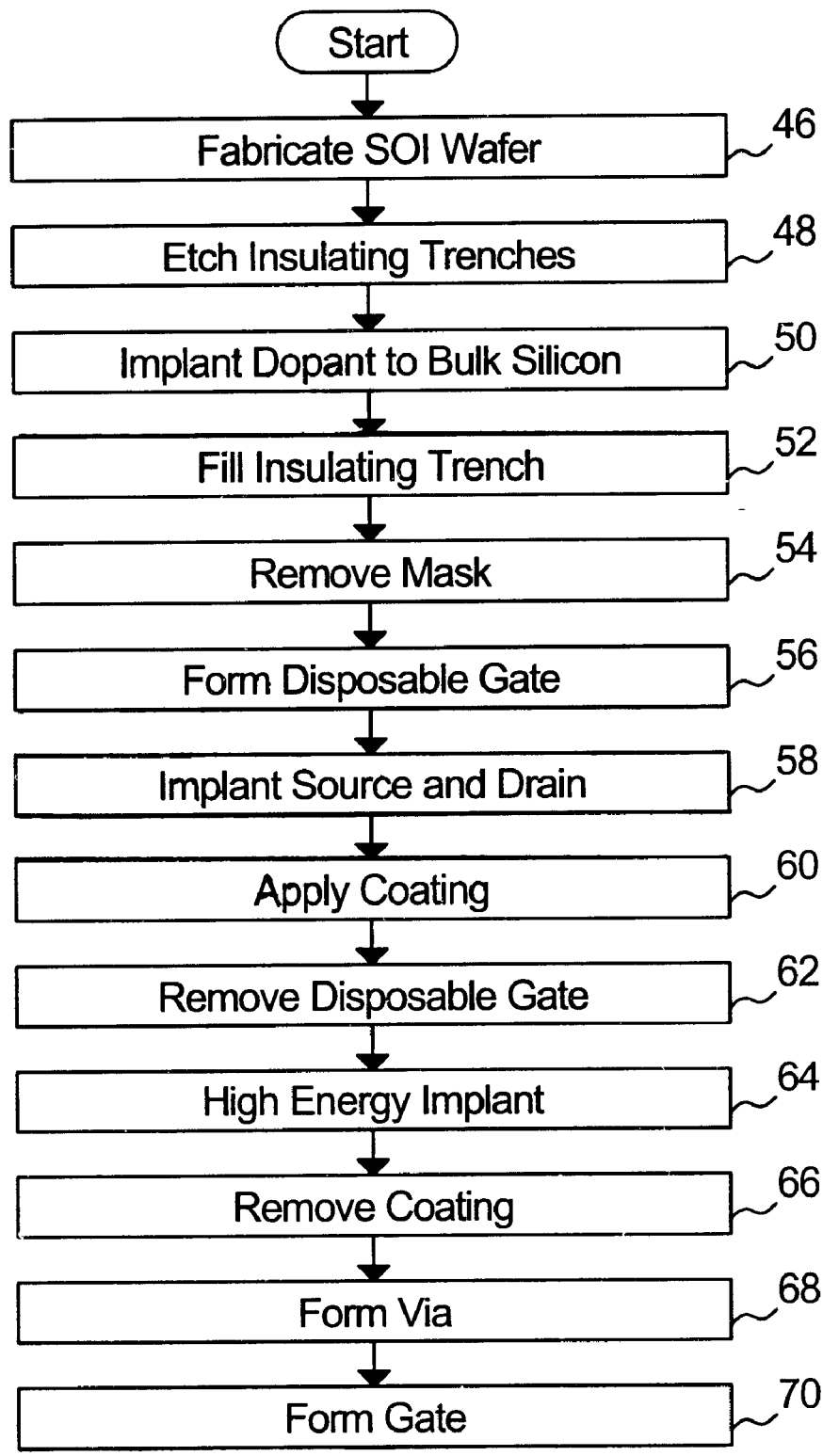
FIG. 2 is a flow chart showing exemplary steps for fabricating the SOI FET in accordance with this invention.

Turning to the flowchart of FIG. 2 in conjunction with the cross section diagram of FIGS. 3a through 3j an exemplary process for fabricating the FET 10 of FIG. 1 is shown. Each of FIGS. 3a through 3j represent the cross section A—A of FIG. 1 in various stages of fabrication.

Figure 3A:
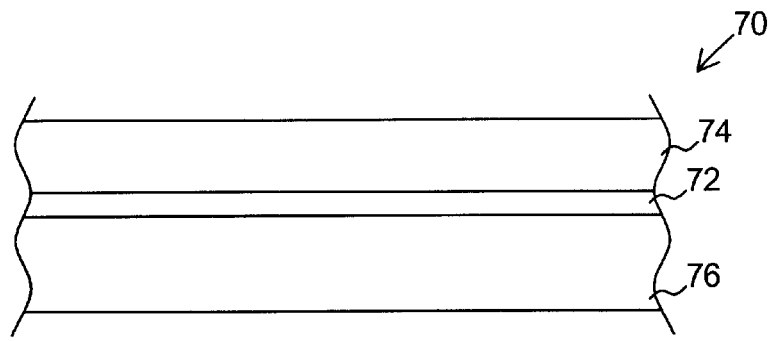
FIG. 3a is a cross section diagram showing a step in the fabrication of the SOI FET in accordance with this invention.

Step 46 represents fabricating an SOI wafer 70 with a base silicon substrate 76, a buried oxide layer 72 approximately 500 angstroms, or less, in thickness, and a device layer 74 approximately 500–1000 angstroms in thickness as shown in FIG. 3a. The SOI wafer 70 my be formed from a bulk silicon wafer using Separation by Implantation of Oxygen (SIMOX) techniques to create a buried oxide layer at a predetermined depth below the surface. Utilizing such techniques, the implanted oxygen oxidizes the silicon into insulating silicon dioxide in a guassian distribution pattern centered at the predetermined depth to form the buried oxide layer 72. Alternatively, the SOI wafer 70 may be formed from two bulk silicon wafers utilizing wafer bonding techniques or a well known cutting technique referred to as Smart Cut®. More specifically, an insulating oxide layer of the desired oxide layer thickness is grown on the surface of a first wafer and then a second wafer is bonded to the oxide layer using a heat fusion process. Thereafter, the first wafer is polished to a desired device layer thickness or cut to expose the desired device layer. The principal advantage of cutting the first wafer is that the discarded portion may be used as one of the two wafers for fabricating additional SOI wafers.

Figure 3B:
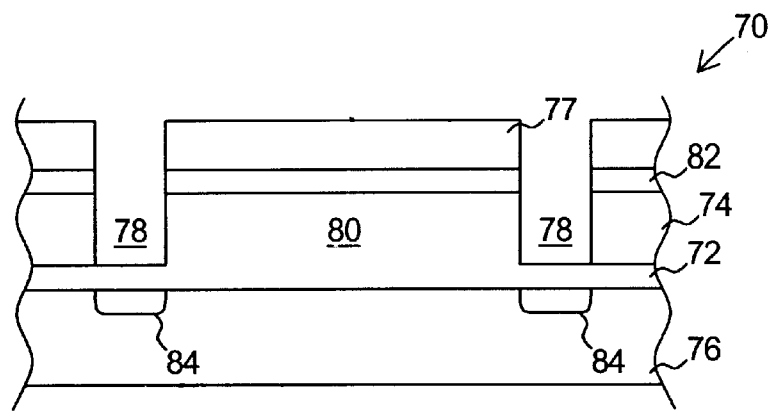
FIG. 3b is a cross section diagram showing a step in the fabrication of the SOI FET in accordance with this invention.

Step 48 represents etching an insulating trench 78 into the silicon device layer 74 to form a device island 80 as shown in FIG. 3b. It should be appreciated that the insulating trench 78 appears to be two trenches in FIG. 3b, however, that is only because FIG. 3b is a cross section. The insulating trench 78 is a single trench extending about the periphery of the device island 80. The insulating trench 78 extends completely through the silicon device layer 74 to the buried oxide layer 72. The etching step 48 includes growing a thin oxide layer 82 on the surface of the wafer and forming a silicon nitride mask 77 to define and expose the area corresponding to the insulating trench 78 for etching.

More specifically, the silicon nitride mask 77 is formed by depositing a layer of silicon nitride on the top surface of the oxide layer 82 and patterning and etching the silicon nitride using conventional photolithography techniques wherein 1) a layer of a UV sensitive photoresist compound is applied to the surface of the silicon nitride; 2) UV light is used to image a pattern on the photoresist; and 3) a developer solution hardens the photoresist in the unexposed areas while the UV light dissolves the photoresist such that it is washed away by the developer in the exposed areas (assuming a positive photoresist) leaving the unexposed portions as a photoresist mask on the surface of the silicon nitride layer.

Once masked, a dry etch with an etching compound that etches silicon nitride while not etching the photoresist removes the silicon nitride layer in the areas that are not masked by the photoresist thereby creating the silicon nitride mask 77. Thereafter, an anisotropic etch with a etching compound such as hydrogen bromide (Hbr) is preferably used to etch the insulating trench 78 in the region not masked by the silicon nitride mask 77.

Step 50 represents doping the bulk substrate 76 within a region 84 which is approximately 1000 angstroms in thickness beneath the insulating trench 78. More specifically, a dosage of approximately 1×10E14 atoms of arsenic or phosphorus is implanted into the substrate at an energy of 100–200 KeV to form region 84 beneath the insulating trench 78. It should be appreciated that the silicon nitride mask 77 which defined the insulating trench 78 operates as a mask during the doping step 50 such that only the substrate 76 beneath the insulating trench 78 is doped.

Figure 3C:
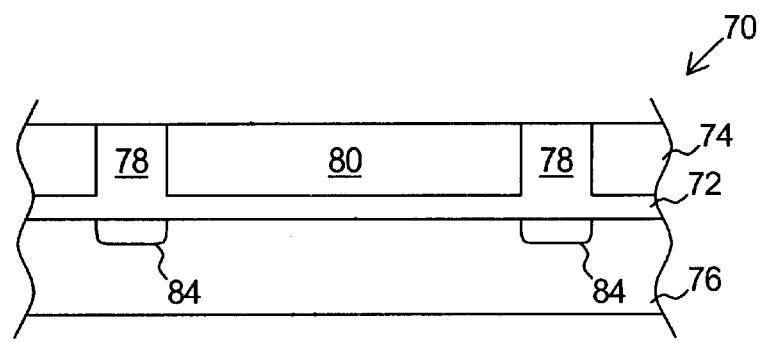
FIG. 3c is a cross section diagram showing a step in the fabrication of the SOI FET in accordance with this invention.

Step 52 then represents utilizing conventional filling techniques to back-fill the insulating trench 78 with an insulating material such as silicon dioxide and step 54 represents removing the silicon nitride mask using a wet chemical mechanical polish yield the cross section as shown in FIG. 3c. Back-filling techniques may include filling the insulating trench 78 with a compound such as SiH4 or TEOS and performing a thermal oxidization to oxidize such compound to form silicon dioxide. Other back-filling techniques known to those skilled in the art may also be used.

Figure 3D:
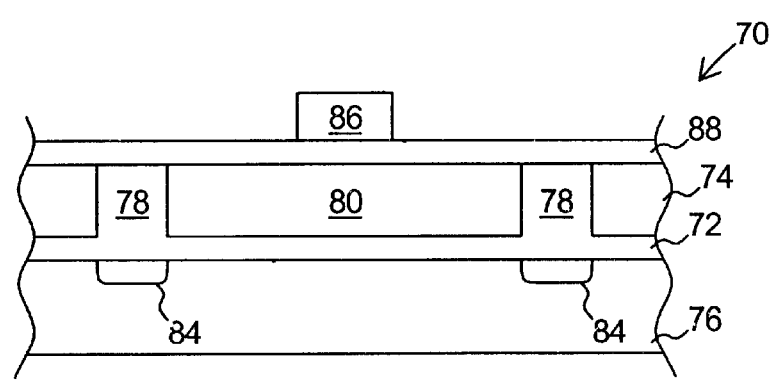
FIG. 3d is a cross section diagram showing a step in the fabrication of the SOI FET in accordance with this invention.
Figure 3E:
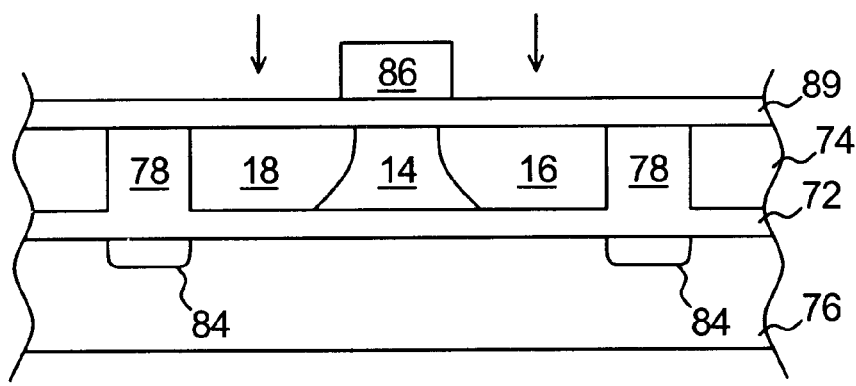
FIG. 3e is a cross section diagram showing a step in the fabrication of the SOI FET in accordance with this invention.

Step 56 represents forming a disposable gate 86 on the surface of the wafer 70 as shown in FIG. 3d. More specifically, a thermal oxidization process is sued to grow a layer of silicon dioxide, forming gate oxide layer 89, across the surface of the device island 80. A polysilicon layer is then deposited on the surface of the gate oxide layer 89 and patterned and etched to form the disposable gate 86. The polysilicon may be deposited using low pressure chemical vapor deposition (LPCVD) as is known by those skilled in the art and etched utilizing the above described photolithography techniques. The disposable gate 86 functions to define and mask the central portion of the device island 80 which will become the channel region 14 as shown in FIG. 3e. At step 58, the source region 16 and drain region 18 on opposing sides of the channel region 14 may be implanted with an n+ dopant such as arsenic.

Figure 3F:
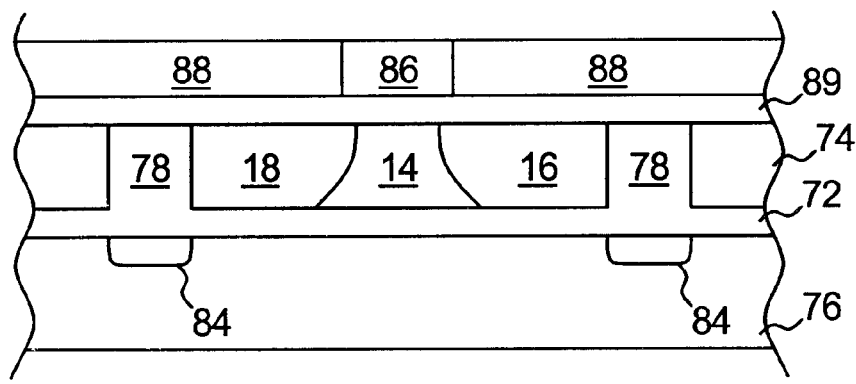
FIG. 3f is a cross section diagram showing a step in the fabrication of the SOI FET in accordance with this invention.
Figure 3G:
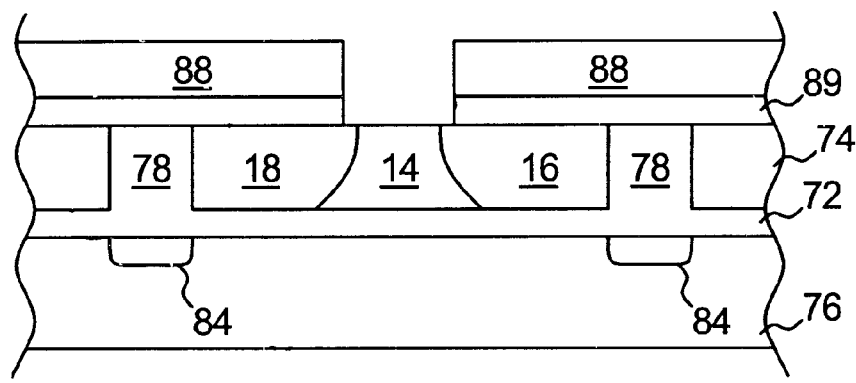
FIG. 3g is a cross section diagram showing a step in the fabrication of the SOI FET in accordance with this invention.

Step 60 represents covering the surface of the wafer 70 with a coating 88 comprising a material such as nitride or oxide and polishing back to expose the disposable gate 86 within the center of the coating 88 as shown in FIG. 3f. Thereafter, at step 62, a dry etch with a compound such as hydrogen bromide (Hbr) is used to remove the disposable gate 86 and expose the surface of the channel region 14 as shown in FIG. 3g.

Figure 3H:
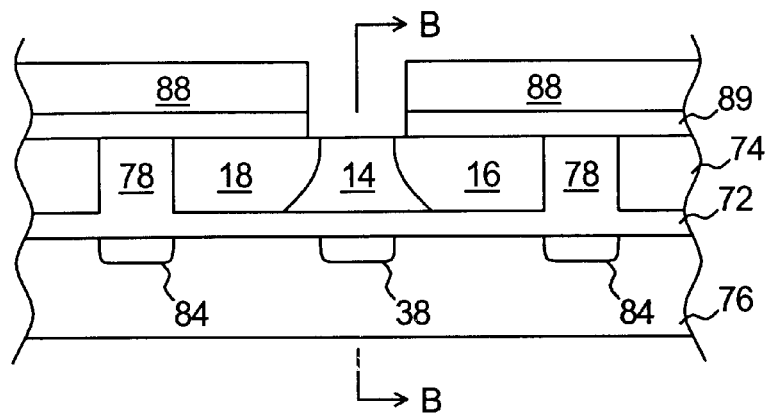
FIG. 3h is a cross section diagram showing a step in the fabrication of the SOI FET in accordance with this invention.
Figure 4A:
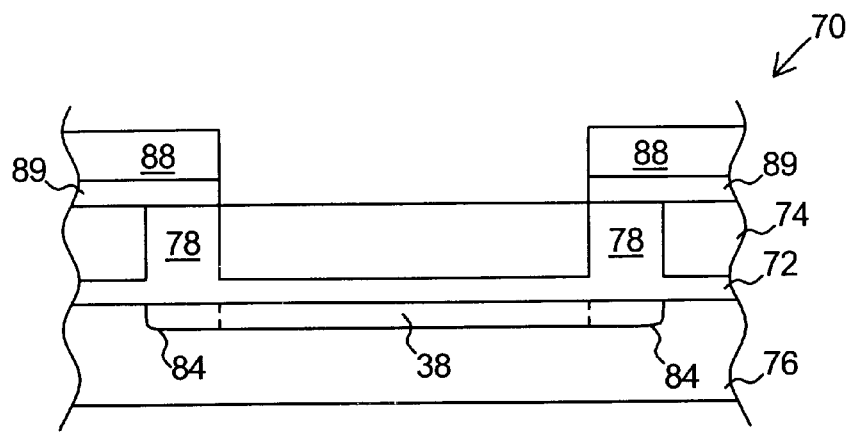
FIG. 4a is a cross section diagram showing a step in the fabrication of the SOI FET in accordance with this invention.

Step 64 represents a high energy implant to dope the backgate region 38 within the bulk silicon 76 below the buried oxide layer 72. More specifically, an implant of a dose of 1×10E14 of arsenic or phosphorus is implanted at an energy of 500 KV to form a retrograde implant within the backgate region 38 as shown in FIG. 3h. It should be appreciated that the coating 88 on each side of the channel region (both being defined by the disposable gate which was subsequently etched away) provides for the backgate region 18 to be in precise alignment with the disposable gate 86 and the channel region 14. Referring briefly to FIG. 4a which shows cross section BB of FIG. 3h, it should also be appreciated that the backgate region 38 contacts the doped region 84 such that the effective back gate 38 extends beneath the insulating trench 78.

Figure 3I:
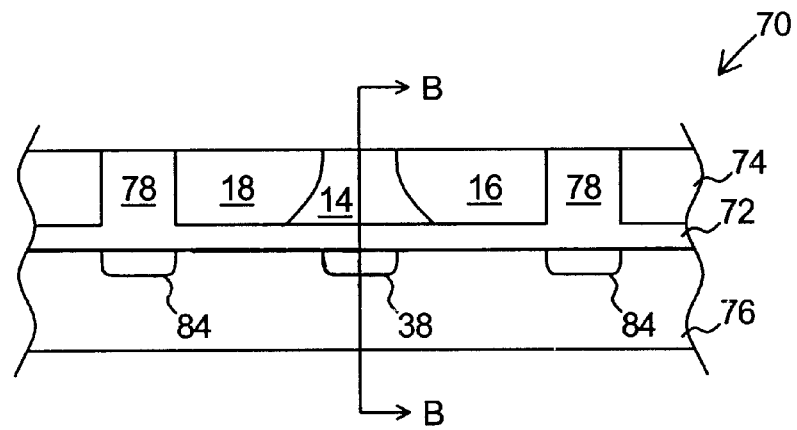
FIG. 3i is a cross section diagram showing a step in the fabrication of the SOI FET in accordance with this invention.
Figure 4B:
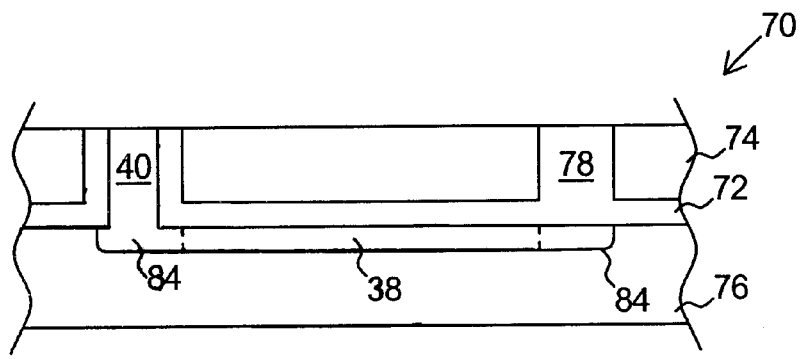
FIG. 4b is a cross section diagram showing a step in the fabrication of the SOI FET in accordance with this invention.

Step 66 represents removing the coating 88 and the gate oxide layer 89 to again expose the surface of the wafer 70 a shown in FIG. 3i. Turning briefly to FIG. 4b, which represents cross section BB of FIG. 3i, step 68 represents etching via 40 into a portion of the insulating trench 78 and back-filling the via 40 with polysilicon. Etching the via 40 is accomplished utilizing conventional photolithography and etching techniques (as described with respect to step 48) and masking compounds and etching compounds of the appropriate selectivity for etching via 40 within the silicon dioxide insulating trench 78. Back-filling via 40 with polysilicon includes depositing polysilicon on the wafer 70 utilizing a LPCVD process and polishing the surface of the wafer to remove the masking compounds.

Figure 3J:
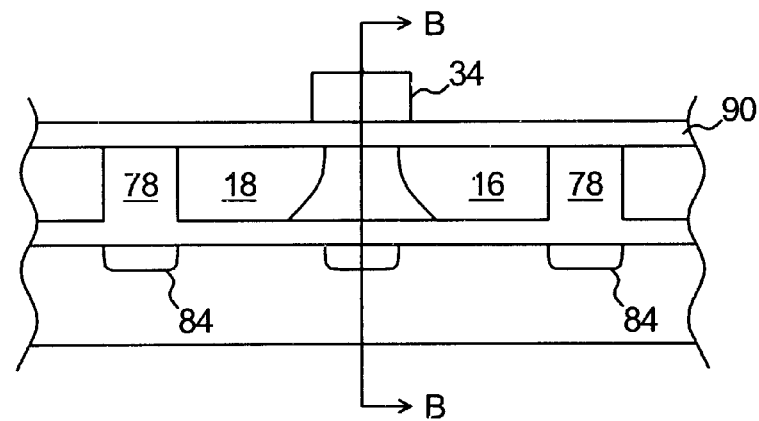
FIG. 3j is a cross section diagram showing a step in the fabrication of the SOI FET in accordance with this invention.
Figure 4C:
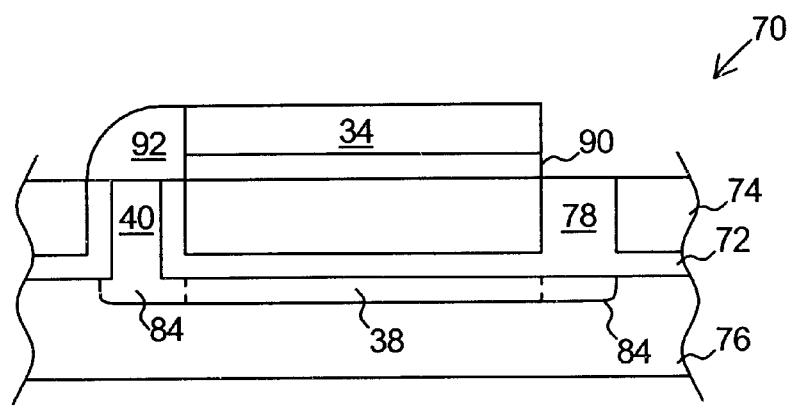
FIG. 4c is a cross section diagram showing a step in the fabrication of the SOI FET in accordance with this invention.

Turning to FIG. 3j, at step 70, another gate oxide layer 90 is grown on the surface of wafer 70 and a layer of polysilicon is deposited, patterned, and etched to form gate 34. Again, the polysilicon may be deposited using LPCVD and the pattern and etching may be accomplished utilizing the above described photolithography techniques. To assure that the gate 34 is precisely positioned over the backgate 38 and the channel region 14, the same reticule as used for patterning the disposable gate 86 in step 56 should be used to pattern the gate 34. As shown in FIG. 4c, which shows cross section BB of FIG. 3J, it can be seen that the polysilicon in via 40 electrically couples the backgate 34 to the surface of the wafer such that a polysilicon (or other conductive) gate extension 92 can provide for electrical coupling between the gate 34 and the via 40.

Although the invention has been shown and described with respect to certain preferred embodiments, it is obvious that equivalents and modifications will occur to others skilled in the art upon the reading and understanding of the specification. For example, the described embodiment relates to an N-Channel FET while those skilled in the art will readily be able to apply the teachings of this invention to a P-Channel FET. The present invention includes all such equivalents and modifications, and is limited only by the scope of the following claims.

What is claimed is:

1. A field effect transistor formed in a semiconductor substrate comprising:
   a) an active region, including a central channel region and a source region and a drain region on opposing sides of the central channel region;
   b) an upper gate positioned above the central channel region and isolated from the central channel region by an insulating gate oxide layer;
   c) a back gate positioned below the central channel region and isolated from the central channel region by an insulating oxide layer; and
   d) an isolation trench region positioned about the periphery of the active region and including a conductive via positioned therein for electrically coupling the upper gate to the back gate.

2. The field effect transistor of claim 1, wherein the upper gate and the back gate each extend over the same portion of the isolation trench region for electrical coupling to the via.

3. The field effect transistor of claim 2, wherein the insulating oxide layer isolating the central channel region form the back gate is the insulating oxide layer of a silicon on insulator wafer.

4. A semiconductor device including a plurality of field effect transistors formed on a semiconductor substrate, the device comprising:
   a) an insulating oxide layer positioned within the semiconductor substrate and separating a device layer portion of the semiconductor substrate form a bulk portion of the semiconductor substrate;
   b) an insulating trench pattern positioned within the device layer and isolating each of the plurality of field effect transistors and each of the plurality of field effect transistors comprises:
      i) an active region positioned within the device layer and including a central channel region and a source region and a drain region on opposing sides of the central channel region;
      ii) an upper gate positioned above the central channel region and isolated from the central channel region by an insulating gate oxide layer;
      iii) a back gate positioned below the central channel region and within the bulk portion of the semiconductor substrate and isolated from the central channel region by insulating oxide layer; and
      iv) a conductive via positioned within the insulating trench pattern for electrically coupling the upper gate to the back gate.

5. The semiconductor device of claim 4, wherein the upper gate and the back gate each extend over the same portion of the insulating trench pattern for electrical coupling to the via.

6. The field effect transistor of claim 1, further comprising a doped region approximately 1000 angstroms in thickness positioned within a bulk portion of the semiconductor substrate and positioned adjacent to the insulating oxide layer and extending about the periphery of the active region beneath the isolation trench.

7. The field effect transistor of claim 1, wherein the back gate comprises a retrograde implant immediately beneath the insulating oxide layer opposite the central channel region.

8. The field effect transistor of claim 4, further comprising a doped region approximately 1000 angstroms in thickness positioned within the bulk portion of the semiconductor substrate and positioned adjacent to the insulating oxide layer within a region corresponding to the insulating trench pattern.

9. The field effect transistor of claim 4, wherein the back gate comprises a retrograde implant immediately beneath the insulating oxide layer opposite the central channel region.

* * * * *

UNITED STATES PATENT AND TRADEMARK OFFICE
CERTIFICATE OF CORRECTION

PATENT NO. : 6,611,023 B1
DATED : August 26, 2003
INVENTOR(S) : En et al.

It is certified that error appears in the above-identified patent and that said Letters Patent is hereby corrected as shown below:

Column 1,
Line 8, replace "FETS" with -- FETs --.

Signed and Sealed this

Twenty-third Day of March, 2004

JON W. DUDAS
*Acting Director of the United States Patent and Trademark Office*